United States Patent
Rao et al.

(10) Patent No.: US 12,198,967 B2
(45) Date of Patent: Jan. 14, 2025

(54) SUBSTRATE SUPPORT DESIGNS FOR A DEPOSITION CHAMBER

(71) Applicant: Applied Materials, Inc., Santa Clara, CA (US)

(72) Inventors: Kaushik Rao, Bangalore (IN); Govinda Raj, Santa Clara, CA (US); Anubhav Srivastava, Bangalore (IN); Santhosh Kumar Pillappa, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 540 days.

(21) Appl. No.: 17/277,152

(22) PCT Filed: Jul. 3, 2019

(86) PCT No.: PCT/US2019/040459
§ 371 (c)(1),
(2) Date: Mar. 17, 2021

(87) PCT Pub. No.: WO2020/086122
PCT Pub. Date: Apr. 30, 2020

(65) Prior Publication Data
US 2021/0375658 A1     Dec. 2, 2021

(30) Foreign Application Priority Data

Oct. 24, 2018   (IN) .............................. 201841040138

(51) Int. Cl.
*H01L 21/683*   (2006.01)
*H01J 37/32*    (2006.01)
*H01T 23/00*    (2006.01)

(52) U.S. Cl.
CPC .... *H01L 21/6833* (2013.01); *H01J 37/32715* (2013.01); *H01J 2237/2007* (2013.01); *H01J 2237/332* (2013.01)

(58) Field of Classification Search
CPC ....................... H01L 21/6833; H01J 37/32715
(Continued)

(56) References Cited

U.S. PATENT DOCUMENTS 5,522,937 A    6/1996 Chew et al.
6,067,222 A *  5/2000 Hausmann .......... H01L 21/6833
                                              279/128

(Continued)

FOREIGN PATENT DOCUMENTS

CN    1676568 A    10/2005
CN  104871305 A    8/2015
(Continued)

OTHER PUBLICATIONS

Taiwan Office Action dated Jan. 17, 2023 for Application No. 111127486.
(Continued)

*Primary Examiner* — Jared Fureman
*Assistant Examiner* — Lucy M Thomas
(74) *Attorney, Agent, or Firm* — Patterson + Sheridan, LLP

(57) ABSTRACT

The present disclosure generally relates to a substrate support that includes a body having a substrate receiving surface, the body comprising a dielectric material. The body also includes a first foil embedded in the body below the substrate receiving surface. The body also includes an electrically conductive mesh embedded in the body below the first foil. The body also includes a center tap structure formed in a bottom surface of the body that is in electrical communication with the mesh.

19 Claims, 11 Drawing Sheets

(58) Field of Classification Search
USPC .......................................................... 361/234
See application file for complete search history.

(56) References Cited

U.S. PATENT DOCUMENTS

| | | | |
|---|---|---|---|
| 2005/0274324 A1* | 12/2005 | Takahashi | H01L 21/6831 |
| | | | 118/723 E |
| 2008/0138645 A1 | 6/2008 | Kawajiri et al. | |
| 2008/0190364 A1 | 8/2008 | Mahon et al. | |
| 2009/0201622 A1 | 8/2009 | Brown et al. | |
| 2011/0063771 A1* | 3/2011 | Nishioka | H01L 21/6833 |
| | | | 361/234 |
| 2015/0076135 A1 | 3/2015 | Merry et al. | |

FOREIGN PATENT DOCUMENTS

| | | |
|---|---|---|
| CN | 108022852 A | 5/2018 |
| CN | 210443540 U | 5/2020 |
| JP | H10-072260 A | 3/1998 |
| JP | 2002-150960 A | 5/2002 |
| JP | 2009-149964 | 7/2009 |
| JP | 2010251723 A | 11/2010 |
| KR | 10-2014-0012679 A | 2/2014 |
| KR | 10-2015-0094712 A | 8/2015 |

OTHER PUBLICATIONS

Taiwan Office Action dated Nov. 25, 2021 for Application No. 110124917.
International Search Report and Written Opinion in related application PCT/US2019/040459 dated Oct. 25, 2019.
Japanese Office Action dated Nov. 7, 2023 for JP 2021-533308.
Korean Office Action dated Feb. 13, 2024 for Application No. 10-2021-7010331.
China Office Action dated May 23, 2024 for Application No. 201910717056.1.

* cited by examiner

SUBSTRATE SUPPORT DESIGNS FOR A DEPOSITION CHAMBER

BACKGROUND

Field

The present disclosure generally relates to apparatus and methods for a substrate support, such as a susceptor or an electrostatic chucking device, for supporting a substrate in a deposition chamber.

Description of the Related Art

Integrated circuits have evolved into complex devices that can include millions of components (e.g., transistors, capacitors, resistors, and the like) on a single chip. The evolution of chip designs requires faster circuitry as well as greater circuit density, and the demand for greater circuit density necessitates a reduction in the dimensions of the integrated circuit components. For example, ultra-large-scale integrated (ULSI) circuit devices may include more than one million electronic devices (e.g., transistors) that are formed on a semiconductor substrate, such as a silicon (Si) substrate, and which cooperate to perform various functions within the device.

An electrostatic chuck, or an ESC, is typically utilized to hold a substrate on a substrate support within a deposition or etch chamber to form these devices. Temperature uniformity of the substrate, which provides uniform deposition of films on the substrate, is affected by the temperature of the substrate support. Typically, the ESC is coupled to a ground potential. However, the electromagnetic energy from the ground may negatively affect temperature monitoring device operation. Additionally, chamber clean processes typically employ gases that are corrosive to the ESC hardware, which can shorten the usable life of the ESC.

What is needed is a method and apparatus that can alleviate one or more of the issues discussed above.

SUMMARY

The present disclosure generally relates to a substrate support that includes a body having a substrate receiving surface, the body comprising a dielectric material. The body also includes a first foil embedded in the body below the substrate receiving surface. The body also includes an electrically conductive mesh embedded in the body below the first foil. The body also includes a center tap structure formed in a bottom surface of the body that is in electrical communication with the mesh.

In another embodiment, a substrate support is provided that includes a body having a substrate receiving surface, the body comprising a dielectric material, a first foil embedded in the body below the substrate receiving surface, an electrically conductive mesh embedded in the body below the first foil, a second foil embedded in the body between the mesh and a bottom surface of the body, and a center tap structure formed in the bottom surface that is in electrical communication with the mesh.

In another embodiment, substrate support is provided that includes a composite body having a substrate receiving surface, the composite body consisting of a dielectric material that includes a first foil embedded in the body below the substrate receiving surface, an electrically conductive mesh embedded in the body below the first foil, a center tap structure formed in a bottom surface of the body that is in electrical communication with the mesh, a support arm extending from a center of the body that supports the body in a cantilevered manner, a ground cable and a temperature sensor coupled to the body and housed in a parallel relationship within the support arm, and a dielectric member separating the ground cable and the temperature sensor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
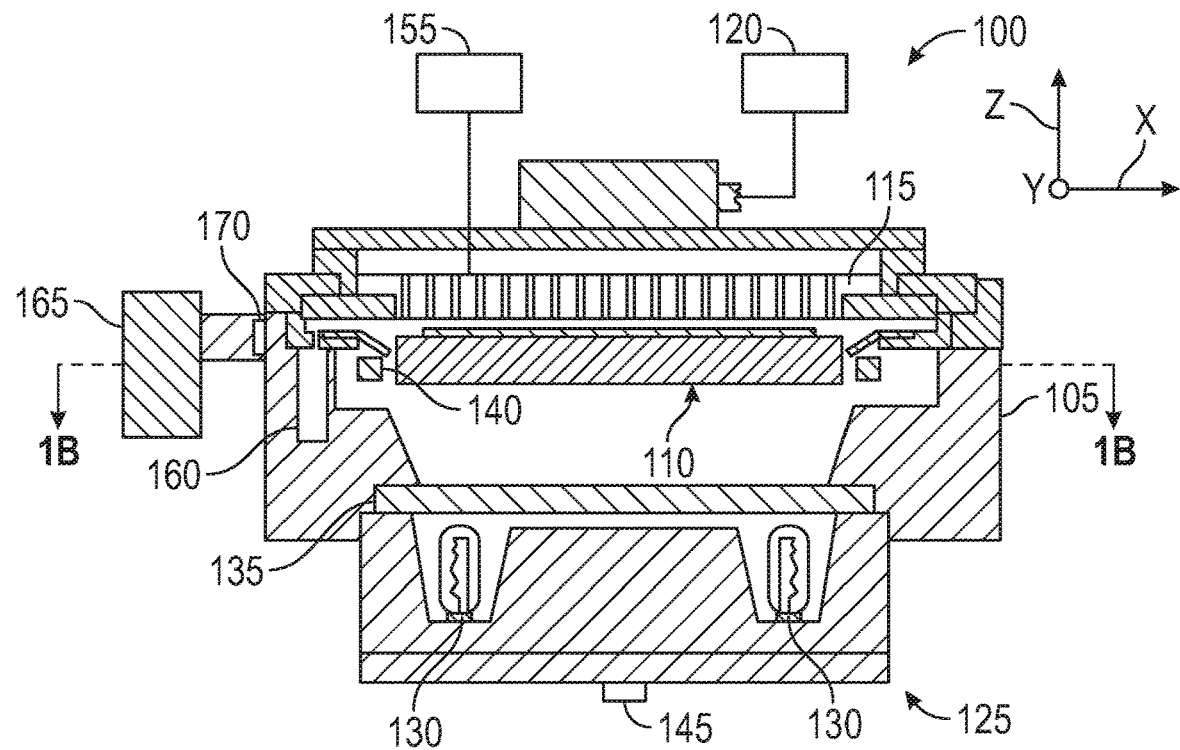
FIG. 1A is a schematic sectional view of a deposition chamber according to one embodiment.
Figure 1B:
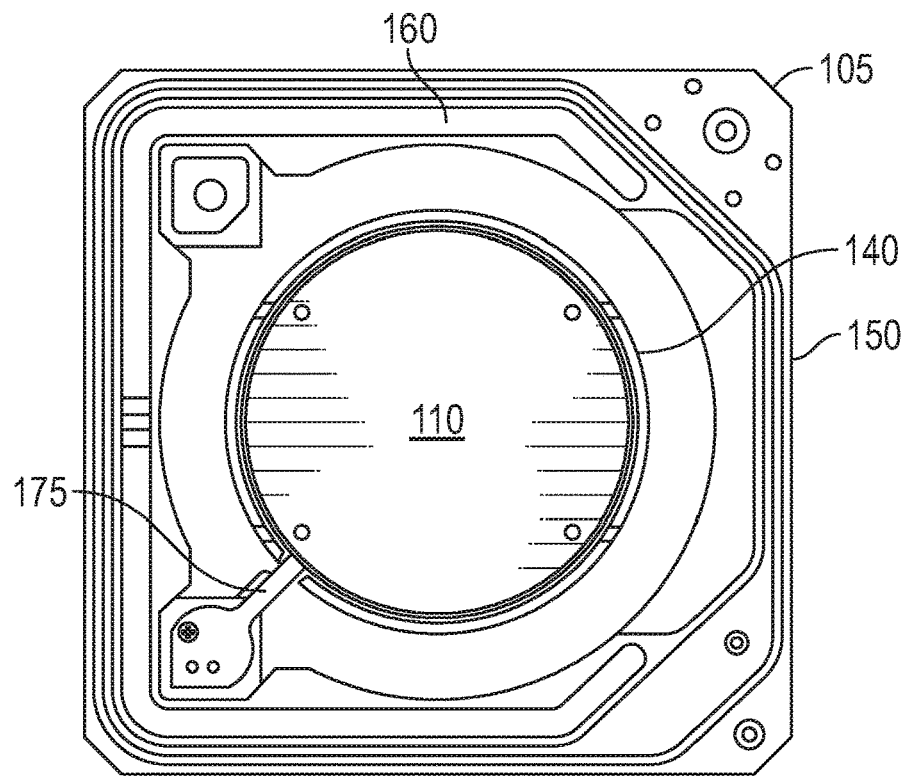
FIG. 1B is a top plan view of the deposition chamber along lines 1B-1B of FIG. 1A.

FIG. 1A is a schematic sectional view of a deposition chamber 100. FIG. 1B is a top plan view of the deposition chamber 100 along lines 1B-1B of FIG. 1A. The deposition chamber 100 includes a body 105 housing a substrate support 110. A showerhead or perforated faceplate 115 is positioned above the substrate support 110. The substrate support 110 may also support an electrostatic chuck, a vacuum chuck or other chucking device to secure a substrate thereon during processing. The perforated faceplate 115 distributes gases from a gas source 120 that forms films on a substrate (not shown) that is supported by the substrate support 110. The substrate support 110, as well as a substrate positioned thereon, is heated by a lamphead 125 disposed below the substrate support 110. The lamphead 125 includes a plurality of lamps 130. The lamphead 125 is adapted to heat the substrate support 110 to temperature between about 400 degrees Celsius and about 480 degrees Celsius. The lamphead 125 is separated from the chamber volume by an optically transparent plate 135.

The substrate support 110 is at least partially surrounded by a hoop structure 140 that is utilized to facilitate transfer of a substrate onto and off of the substrate support 110. The substrate support 110 is coupled to a motor 145 adapted to lift and lower the substrate support 110 in the Z direction relative to the hoop structure 140. For example, to remove a substrate from the substrate support 110, the substrate support 110 is lowered while the substrate is suspended by the hoop structure 140. Thereafter, a robot blade enters a transfer port 150 (shown in FIG. 1B) and removes the substrate from the hoop structure 140.

The perforated faceplate 115 is coupled to a power source 155, such as a radio frequency power source. The perforated faceplate 115 is a conductive metal material, such as aluminum, and the power source 155 energizes the perforated faceplate 115 to create a plasma between the perforated faceplate 115 and the substrate support 110, which is grounded. The energization of the perforated faceplate 115 to form the plasma is typically utilized during a cleaning process where cleaning gases, such as chlorine, fluorine, or other cleaning gases, are broken into radical species for cleaning the deposition chamber 100. Excess gases are removed from the deposition chamber 100 via a pumping channel 160 that surrounds the interior of the deposition chamber 100. An endpoint detection device 165 is coupled to the deposition chamber 100. The endpoint detection device 165 is an optical device that views the interior of the deposition chamber 100 through a window 170.

Referring to FIG. 1B, the substrate support 110 is cantilevered and is coupled to a support arm 175. The support arm 175 also contains electrical leads, such as a ground cable as well as a temperature sensor leads, both of which will be explained in more detail below.

Figure 2B:
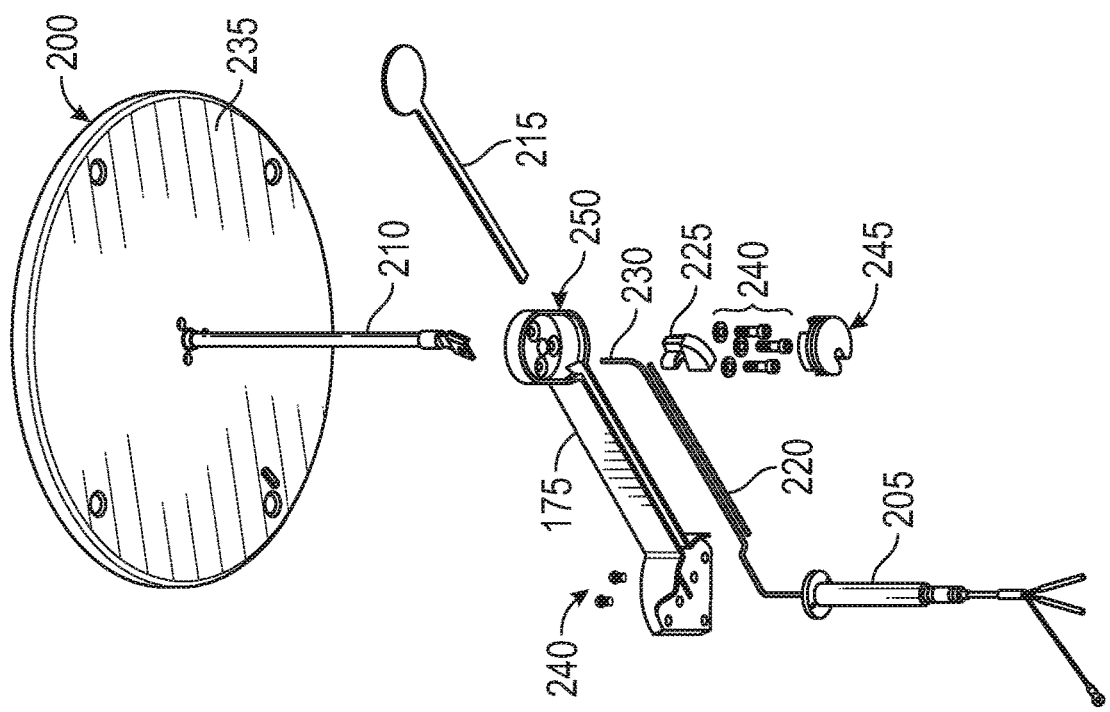
FIG. 2B is an exploded view of the substrate support of FIG. 2A.
Figure 2A:
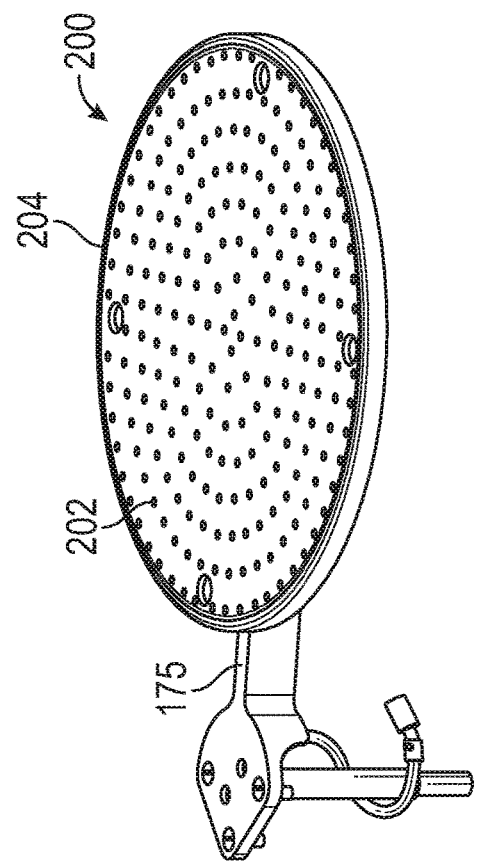
FIG. 2A is an isometric view illustrating one embodiment of a substrate support.

FIG. 2A is an isometric view illustrating one embodiment of a substrate support 200. FIG. 2B is an exploded view of the substrate support 200 of FIG. 2A. The substrate support 200 may be utilized as the substrate support 110 in the deposition chamber 100 of FIGS. 1A and 1B.

Figure 3B:
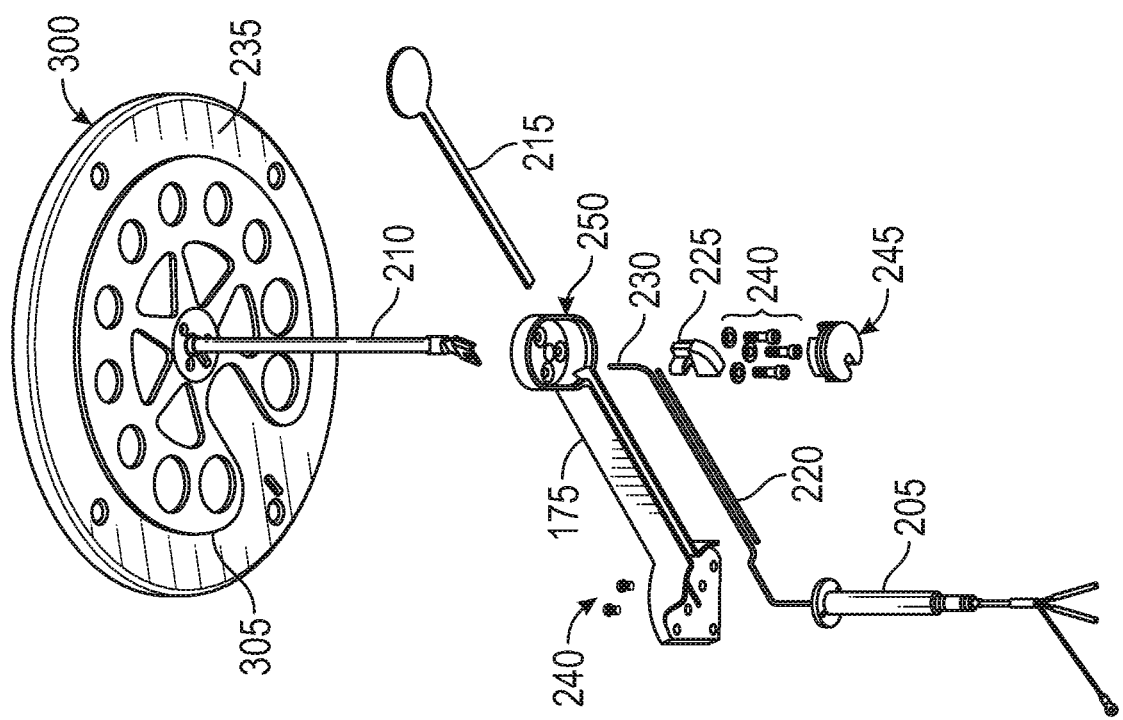
FIG. 3B is an exploded view of the substrate support of FIG. 3A.
Figure 3A:
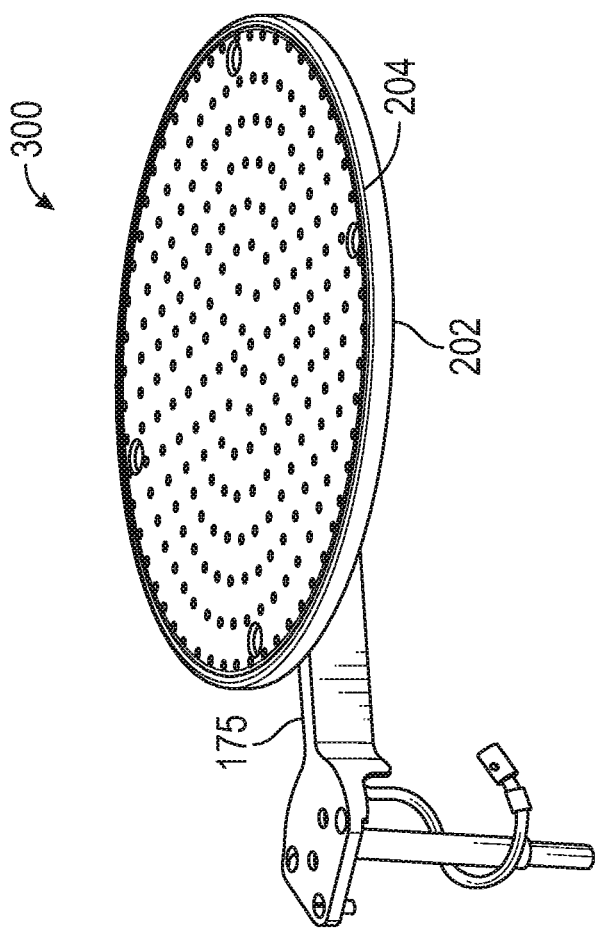
FIG. 3A is an isometric view illustrating another embodiment of a substrate support.

FIG. 3A is an isometric view illustrating another embodiment of a substrate support 300. FIG. 3B is an exploded view of the substrate support 300 of FIG. 3A. The substrate support 300 may be utilized as the substrate support 110 in the deposition chamber 100 of FIGS. 1A and 1B.

Both of the substrate support 200 and the substrate support 300 share common components with at least one exception. The substrate support 300 includes a backing plate 305 where the substrate support 200 does not. The backing plate 305 is an aluminum oxide material.

Common components of both of the substrate support 200 and the substrate support 300 include a substrate receiving surface 202 having a plurality of raised features or protrusions 204, the support arm 175, a hollow shaft 205 that couples to the support arm 175, a ground cable 210, and a dielectric cover plate 215. A spacing member 220 and a cable guide 225 is utilized to house and/or guide a temperature sensor 230 to a body 235 of the respective substrate support 200 and the substrate support 300. Fasteners 240 are utilized to secure the various components to each other and/or to the body 235. A dielectric cover 245 is positioned at an interface portion 250 of the support arm 175. Many of these components will be described in more detail below.

Figure 4A:
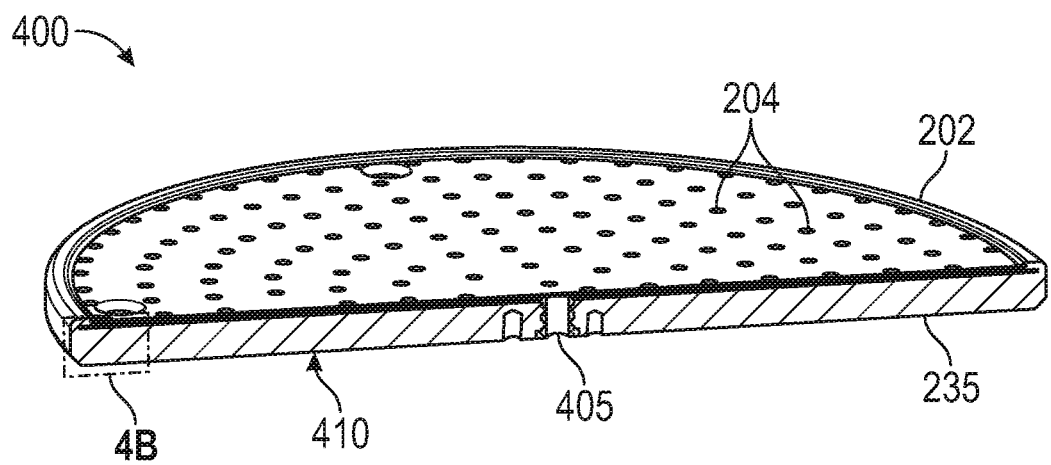
FIG. 4A is an isometric sectional view of another embodiment of a substrate support.

FIG. 4A is an isometric sectional view of another embodiment of a substrate support 400. The substrate support 400 includes a body 235 that may be the body 235 of the substrate support 200 of FIGS. 2A and 2B or the substrate support 300 of FIGS. 3A and 3B. The substrate receiving surface 202 is shown having the plurality of protrusions 204 where a substrate (not shown) is supported. Additionally, a center tap 405 is shown extending from a bottom surface 410 of the body 235. The center tap 405 is utilized to connect the ground cable 210 (shown in FIGS. 2B and 3B) to the body 235.

Figure 4B:
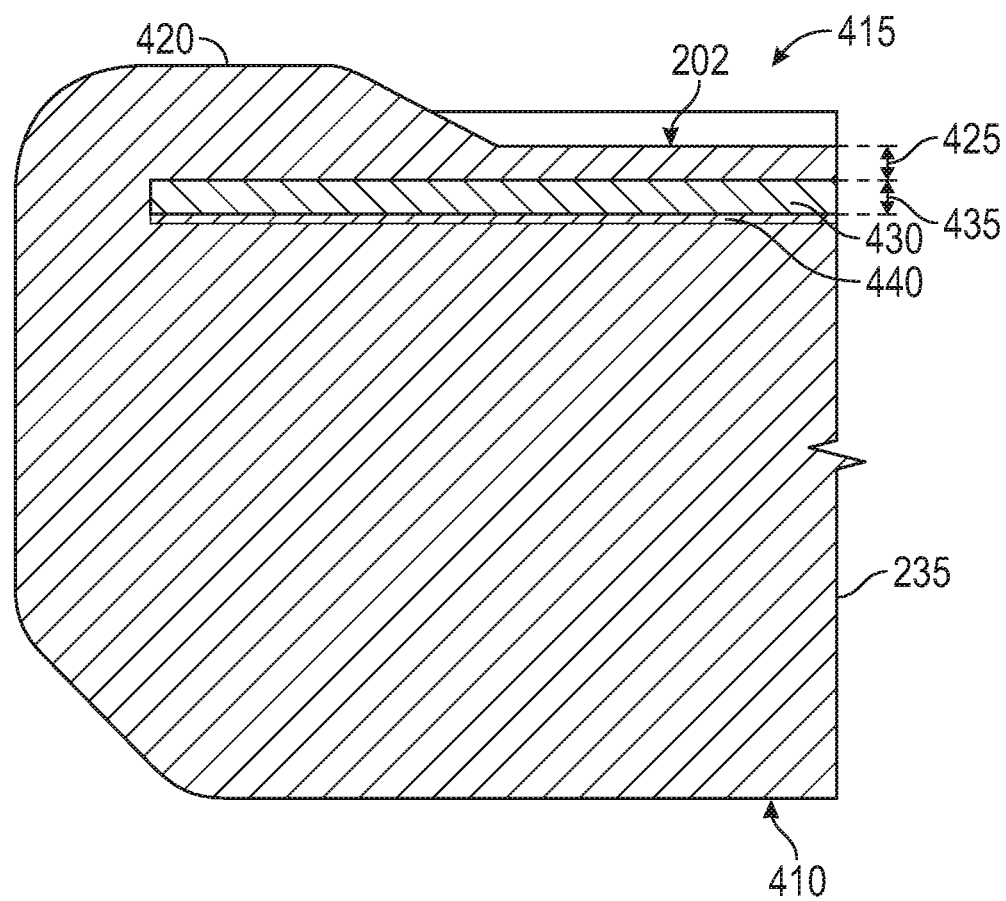
FIG. 4B is an enlarged cross-section of a portion of the body shown in FIG. 4A.

FIG. 4B shows an enlarged cross-section of a portion of the body 235 shown in FIG. 4A. The body 235 is ceramic material, such as aluminum nitride (AlN). The body 235 includes a substrate pocket 415 that is recessed from an upper surface 420 of the body 235. Positioned a distance 425 below the substrate pocket 415 is a thin sheet or foil 430. The foil 430 is a graphite material. In one embodiment, the distance 425 is about 0.01 inches to about 0.03 inches. A thickness 435 of the foil 430 is about 0.01 inches to about 0.03 inches in one embodiment. A mesh 440 made of a thermally and/or electrically conductive material, such as molybdenum (Mo), is positioned below the foil 430.

The mesh 440 is embedded in the body 235 which is substantially a dielectric material (e.g., ceramic) and functions as an electrode within the body 235. The foil 430, positioned between the substrate pocket 415 and the mesh 440 serves to enhance temperature distribution within and/or across the body 235. The enhanced temperature uniformity increases temperature uniformity of a substrate positioned on the substrate receiving surface 202.

Figure 5A:
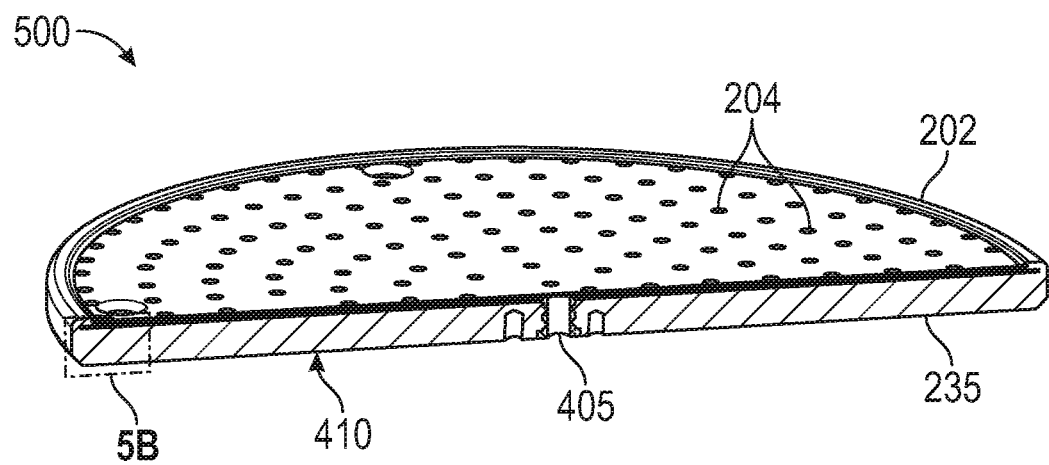
FIG. 5A is an isometric sectional view of another embodiment of a substrate support.

FIG. 5A is an isometric sectional view of another embodiment of a substrate support 500. The substrate support 500 includes a body 235 that may be the body 235 of the substrate support 200 of FIGS. 2A and 2B or the substrate support 300 of FIGS. 3A and 3B. The substrate receiving surface 202 is shown having the plurality of protrusions 204 where a substrate (not shown) is supported. Additionally, a center tap 405 is shown extending from a bottom surface 410 of the body 235. The center tap 405 is utilized to connect the ground cable 210 (shown in FIGS. 2B and 3B) to the body 235.

Figure 5B:
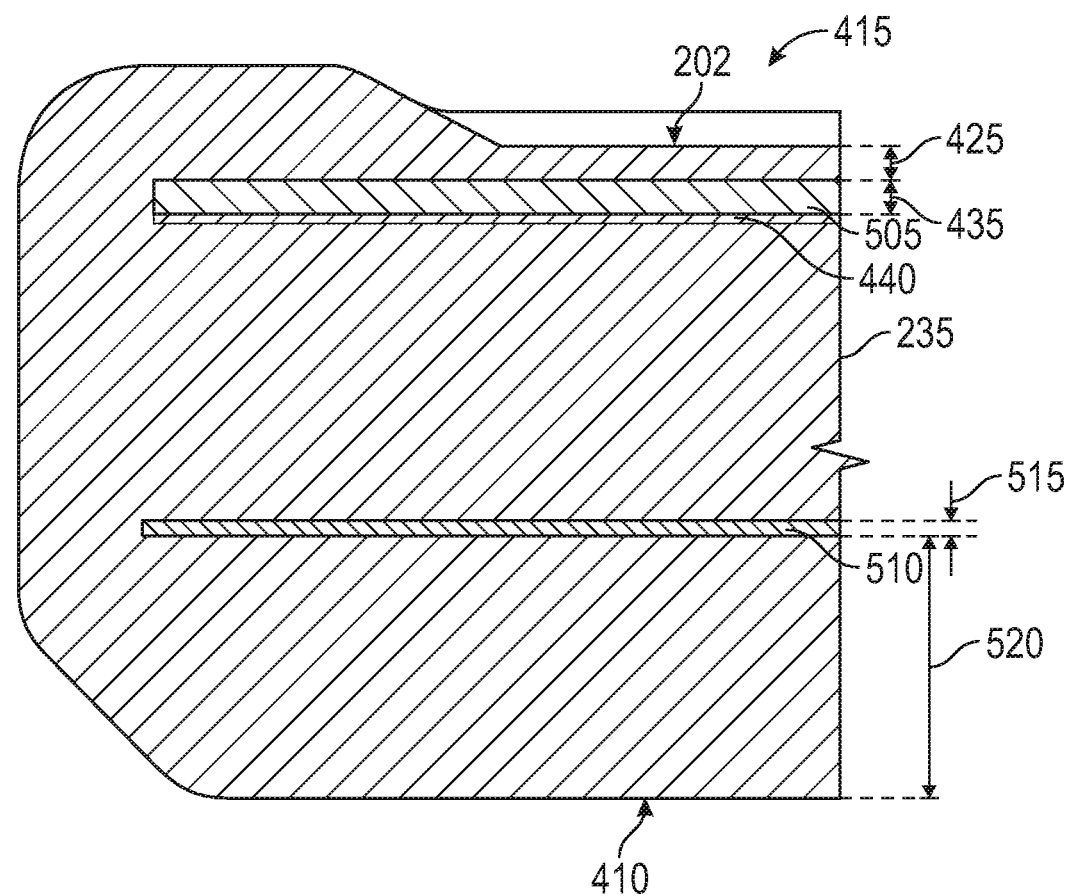
FIG. 5B shows an enlarged cross-section of a portion of the body shown in FIG. 5A.

FIG. 5B shows an enlarged cross-section of a portion of the body 235 shown in FIG. 5A. The body 235 is ceramic material, such as aluminum nitride (AlN). The body 235 includes a substrate pocket 415 that is recessed from an upper surface 420 of the body 235. Positioned a distance 425 below the substrate pocket 415 is a first thin sheet or foil 505. The first foil 505 is a graphite material. The distance 425 and/or a thickness 435 of the foil 505 is variable dependent on specific processes. A mesh 440 made of a thermally conductive material, such as molybdenum (Mo), is positioned below the first foil 505. A second thin sheet of foil 510 is positioned below the mesh 440. The second foil 510 is a zirconium containing material, such as zirconium oxide ($ZrO_2$). A thickness 515 of the second foil 510 as well as a distance 520 of the second foil 510 from the bottom surface 410 of the body 235 is variable dependent on specific processes.

The mesh 440 is embedded in the body 235 which is substantially a dielectric material (e.g., ceramic) and functions as an electrode within the body 235. The first foil 505, positioned between the substrate pocket 415 and the mesh 440 serves to enhance temperature distribution within and/or across the body 235. The enhanced temperature uniformity increases temperature uniformity of a substrate positioned on the substrate receiving surface 202. The second foil 510 serves as a thermal barrier at the bottom surface 410 of the body 235. The second foil 510 may also increase the lifetime of the body 235 of the substrate support 500.

Figure 6A:
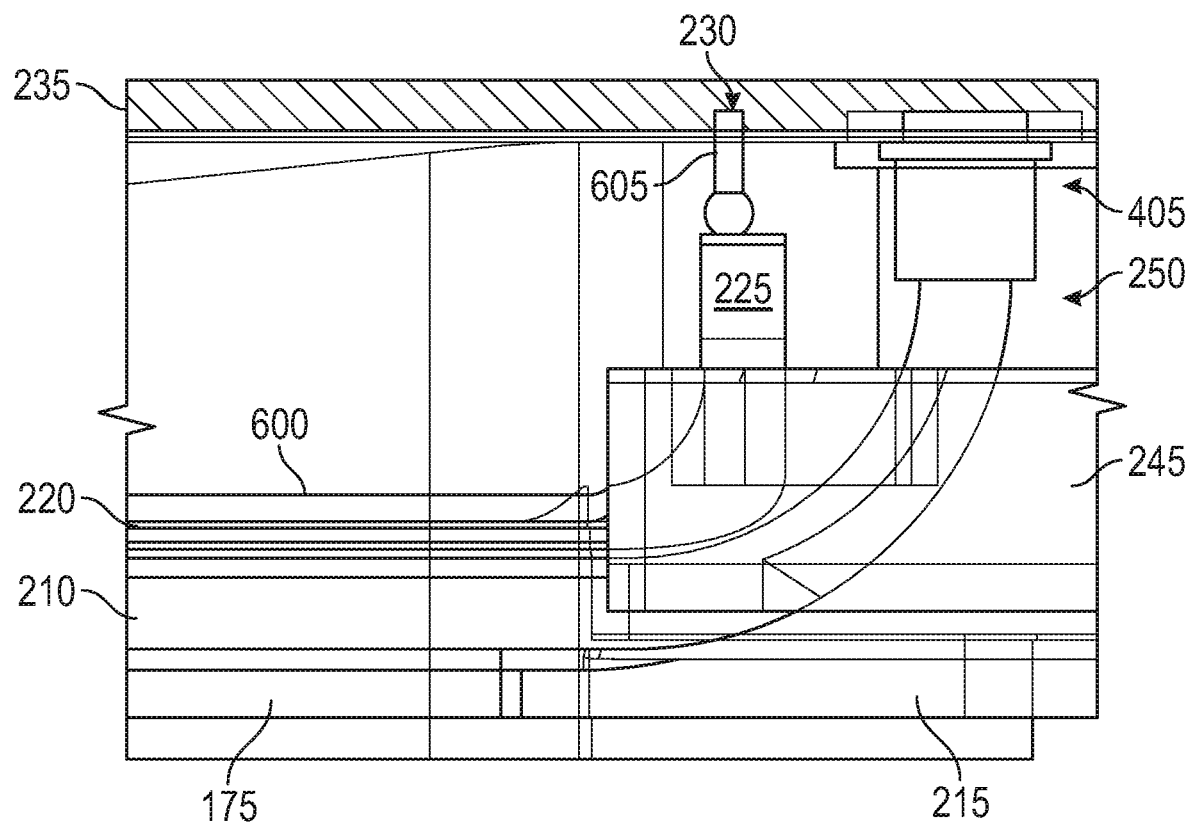
FIG. 6A is an exploded partial cross-sectional view of the body and the interface portion of the support arm.

FIG. 6A is an exploded partial cross-sectional view of the body 235 and the interface portion 250 of the support arm 175. The view shown in FIG. 6A may be any of the substrate support 200, the substrate support 300, or the substrate support 400 as described herein. Portions of the interface portion 250 of the support arm 175 are in phantom in order to show the positions of the ground cable 210 and the temperature sensor 230.

Specifically, the temperature sensor 230 includes a temperature sensor cable 600 that runs in or on the support arm 175 between a sensor head 605 of the temperature sensor 230 and the hollow shaft 205 (shown in FIGS. 2A-3B). However, the temperature sensor cable 600 is placed into proximity with the ground cable 210 which also runs in or along the support arm 175 between the hollow shaft 205 and the center tap 405. This proximal relationship between the temperature sensor cable 600 and the ground cable 210 introduces noise (e.g., electromagnetic interference) into the temperature sensor cable 600. The noise may interfere with proper operation and/or signals received from the temperature sensor 230. However, the spacing member 220 and the cable guide 225 is utilized to minimize or eliminate the introduction of noise from the ground cable 210 and the temperature sensor cable 600.

Figure 6B:
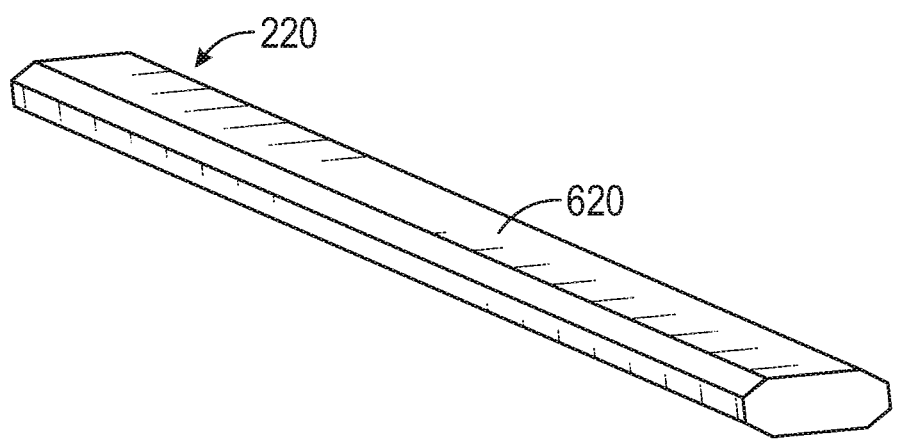
FIG. 6B is an enlarged isometric view of the spacing member and the cable guide.
Figure 6C:
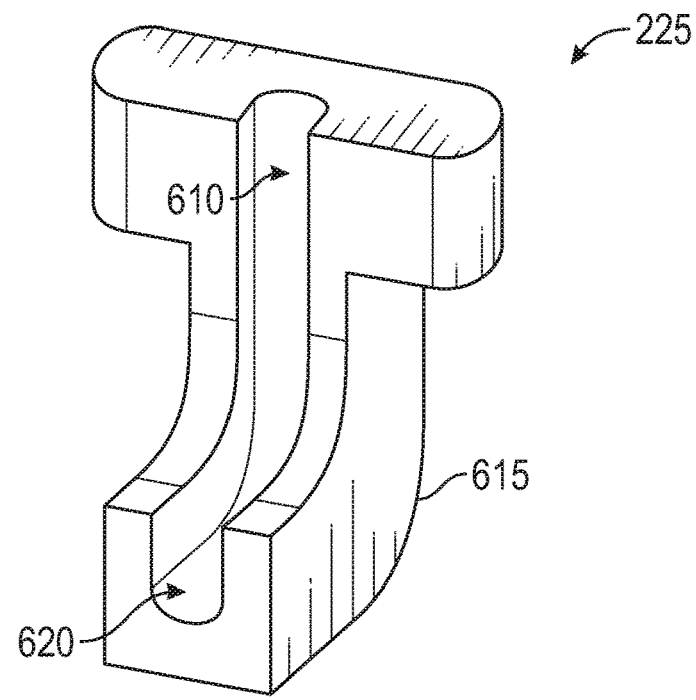
FIG. 6C is an enlarged isometric view of the spacing member and the cable guide.

FIGS. 6B and 6C are enlarged isometric views of the spacing member 220 and the cable guide 225, respectively. Both of the spacing member 220 and the cable guide 225 are made from a dielectric material, such as a ceramic material, for example aluminum oxide ($AlO_2$). The spacing member 220 is an elongate member that interfaces with the cable guide 225. The cable guide 225 includes a groove 610 formed therein. The groove 610 traverses the inner radius of a curved portion 615. The groove 610 serves as a guide for the temperature sensor cable 600 and the sensor head 605. The groove 610 orients the direction of the temperature sensor cable 600 about 90 degrees such that the sensor head 605 interfaces with the body 235 from the (horizontal) orientation of the support arm 175.

Both of the spacing member 220 and the cable guide 225 include an electrically conductive coating 620. For example, surfaces of the spacing member 220 and the cable guide 225 that are in proximity to one or both of the ground cable 210 and the temperature sensor cable 600 include the coating 620. The coating 620 may be gold (Au), silver (Ag), silicon (Si), nickel (Ni), or another conductive substance. The coating 620 is utilized to improve grounding of the spacing member 220 and/or the cable guide 225.

Figure 6D:
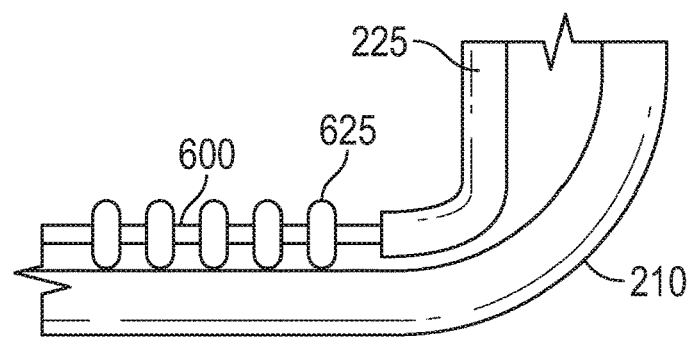
FIG. 6D shows another embodiment of electrically isolating the ground cable from the temperature sensor cable.
Figure 6E:
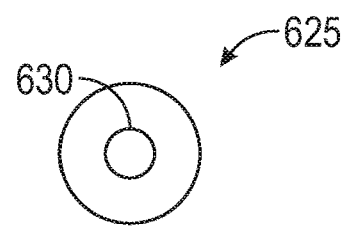
FIG. 6E is side view of one of the dielectric members of FIG. 6D.

FIG. 6D shows another embodiment of electrically isolating the ground cable 210 from the temperature sensor cable 600. In this embodiment, the cable guide 225 of FIGS. 6A and 6C are utilized with a plurality of dielectric members 625. The plurality of dielectric members 625 may be used to replace the spacing member 220 shown in FIGS. 6A and 6B. Each of the dielectric members 625 are substantially ring shaped as shown in FIG. 6E. Each of the dielectric members 625 include a central opening 630 sized to receive the temperature sensor cable 600. Each of the dielectric members 625 may be made of a ceramic material, or a quartz material.

Figure 7A:
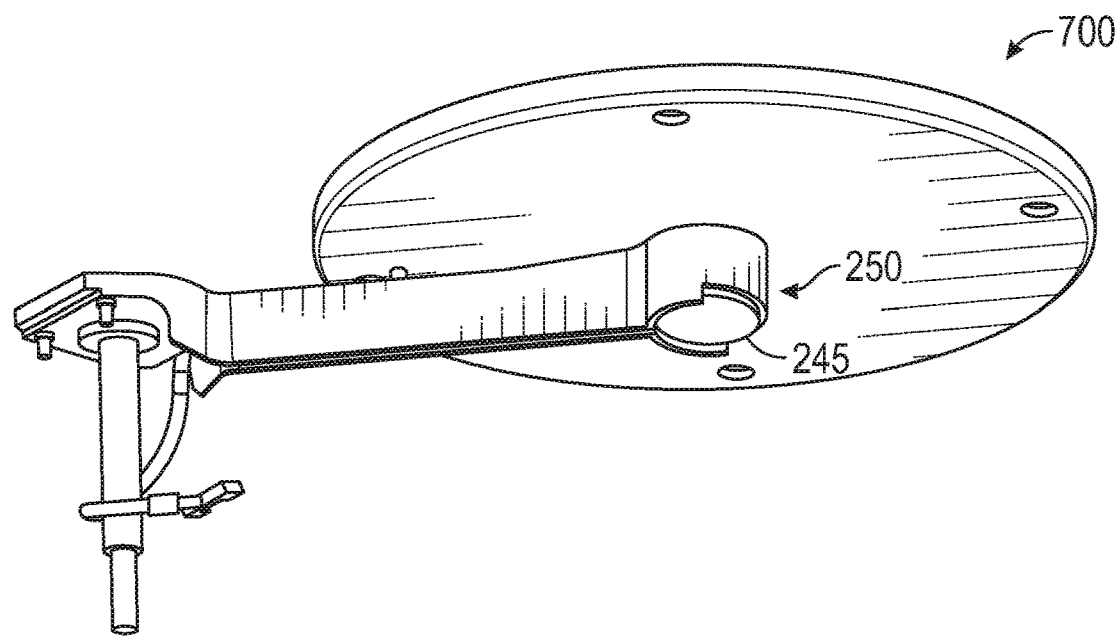
FIG. 7A is an isometric bottom view of a substrate support showing the interface portion of the support arm.

FIG. 7A is an isometric bottom view of a substrate support 700 showing the interface portion 250 of the support arm 175. The substrate support 700 of FIG. 7A may be any of the substrate support 200, the substrate support 300, or the substrate support 400 as described herein.

Figure 7B:
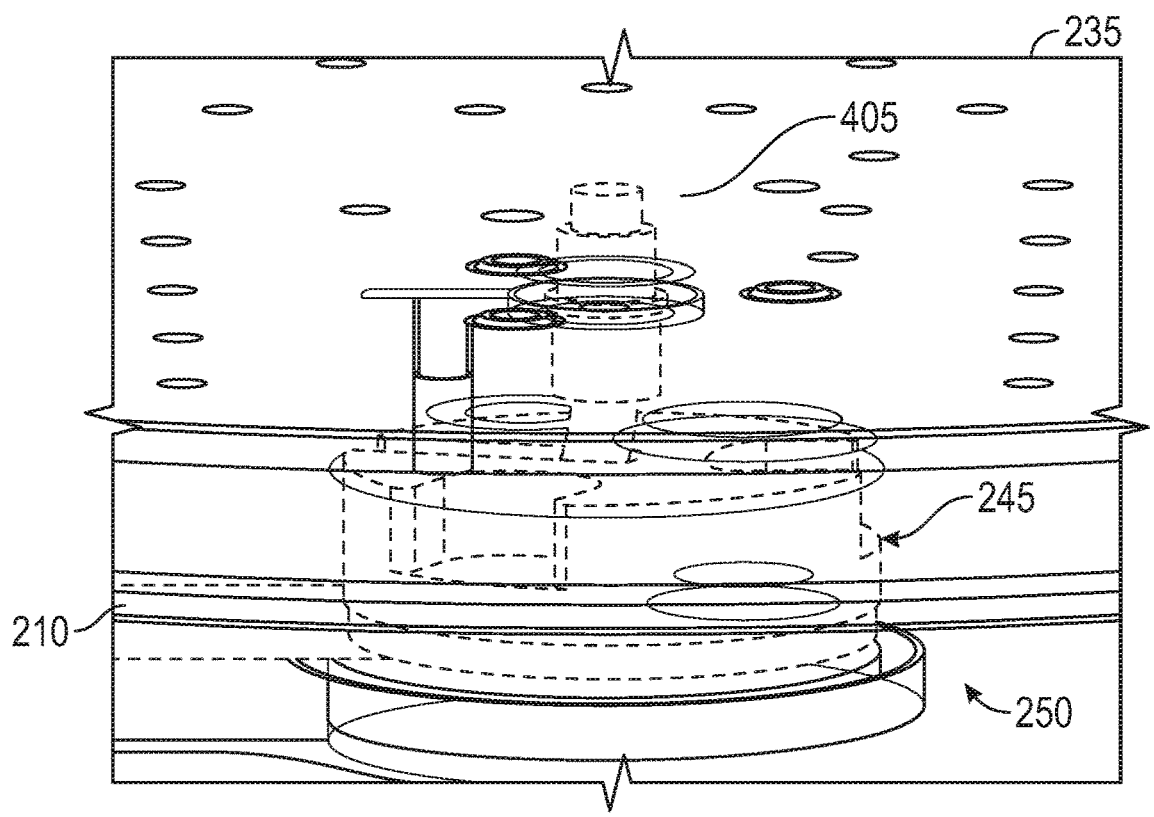
FIG. 7B is an enlarged view of the interface portion of the support arm.

FIG. 7B is an enlarged view of the interface portion 250 of the support arm 175. Portions of the interface portion 250 are shown in phantom in order to show the connection of the dielectric cover 245 with the interface portion 250 of the support arm 175.

Figure 7C:
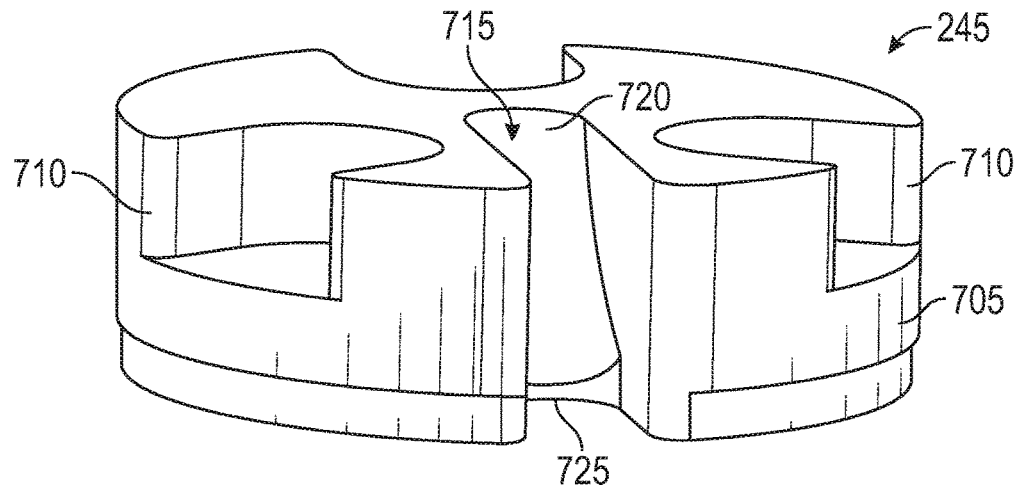
FIG. 7C is an isometric view of the dielectric cover that is rotated 180 degrees from the view shown in FIG. 7B.

FIG. 7C is an isometric view of the dielectric cover 245 that is rotated 180 degrees from the view shown in FIG. 7B. The dielectric cover 245 includes a body 705 having one or more recesses 710 formed therein. The body 705 also includes a central opening 715. The central opening 715 includes a curved portion 720 that terminates at a radially oriented groove 725. The central opening 715, the curved portion 720 and the radially oriented groove 725 are utilized as a guide for the ground cable 210. The dielectric cover 245 is made of a quartz material. The dielectric cover 245 seals the interface portion 250 of the support arm 175 in order to prevent ingress of cleaning gases, such as fluorine and/or chlorine radicals, from reaching the connection of the ground cable 210 and the center tap 405. Typically, the ground cable 210 is coupled to the center tap 405 by a brazed joint, and cleaning gases tend to penetrate this brazed joint and may also deteriorate the mesh 440 (shown in FIGS. 4B and 5B) to which the ground cable 210 is connected. However, the dielectric cover 245 prevents radicals from entering the interface portion 250 of the support arm 175 which increases the lifetime of the substrate support 700.

Figure 8A:
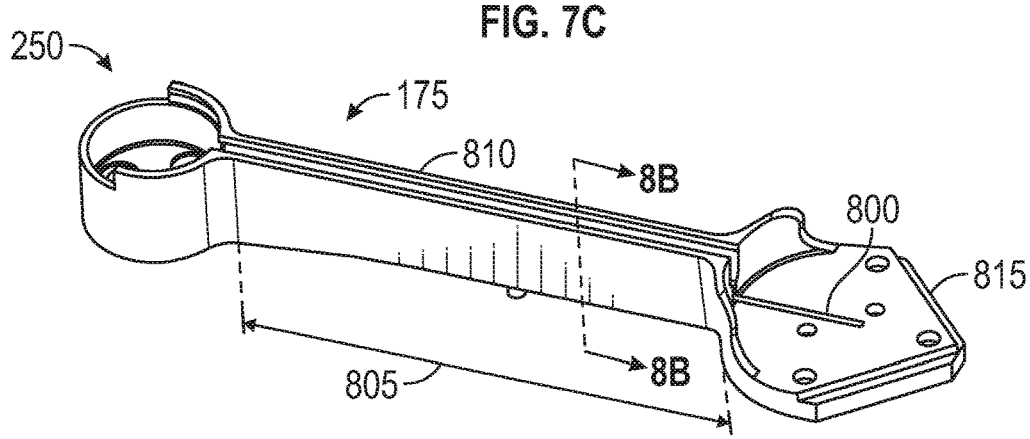
FIG. 8A is an isometric view of one embodiment of the support arm.
Figure 8B:
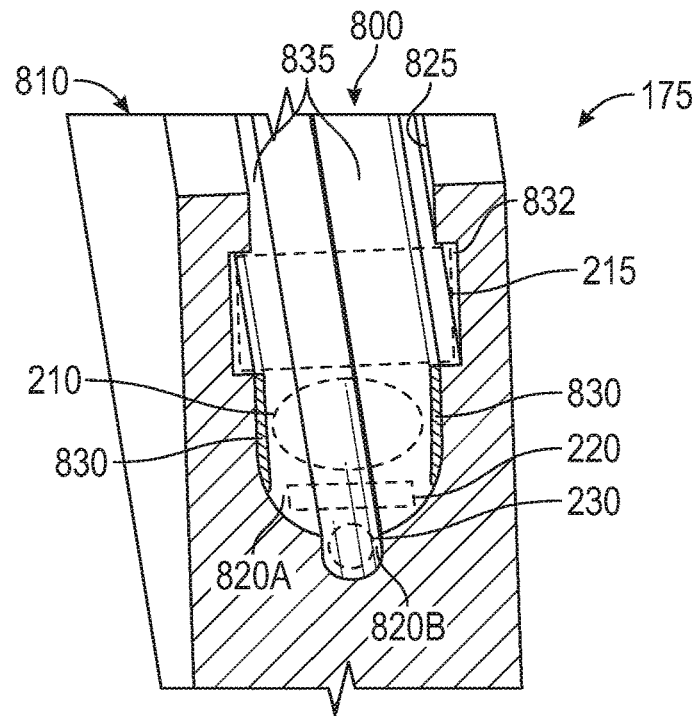
FIG. 8B is a sectional view of the support arm along lines 8B-8B of FIG. 8A.

FIG. 8A is an isometric view of one embodiment of the support arm 175. FIG. 8B is a sectional view of the support arm 175 along lines 8B-8B. The support arm 175 includes a groove 800 formed along a length 805 of a channel 810. The groove 800 also extends at least partially into a surface of a mounting portion 815. The mounting portion 815 is on a side of the support arm 175 opposite to the interface portion 250 of the support arm 175. In FIG. 8B, the ground cable 210, the dielectric cover plate 215, the spacing member 220 and the temperature sensor 230 are shown in phantom.

As shown in FIG. 8B, the groove 800 includes a major groove 820A and a minor groove 820B. The minor groove 820B bifurcates the major groove 820A. The support arm 175 also includes a first or an interior surface 825 of the channel 810. A second or a recessed surface 832 is formed in the interior surface 825 in both sides of the channel 810. The major groove 820A is sized to receive the ground cable 210 (also shown in FIGS. 2B, 3B and 6B). The recessed surfaces 832 are sized to receive the dielectric cover plate 215 (also shown in FIGS. 2B, 3B and 6B).

At least a portion of the groove 800 includes a coating 830. For example, the coating 830 is provided on the major groove 820A. The coating 830 may be gold (Au), silver (Ag), silicon (Si), nickel (Ni), or another conductive substance. The coating 830 is utilized to improve grounding performance of the ground cable 210.

Figure 9A:
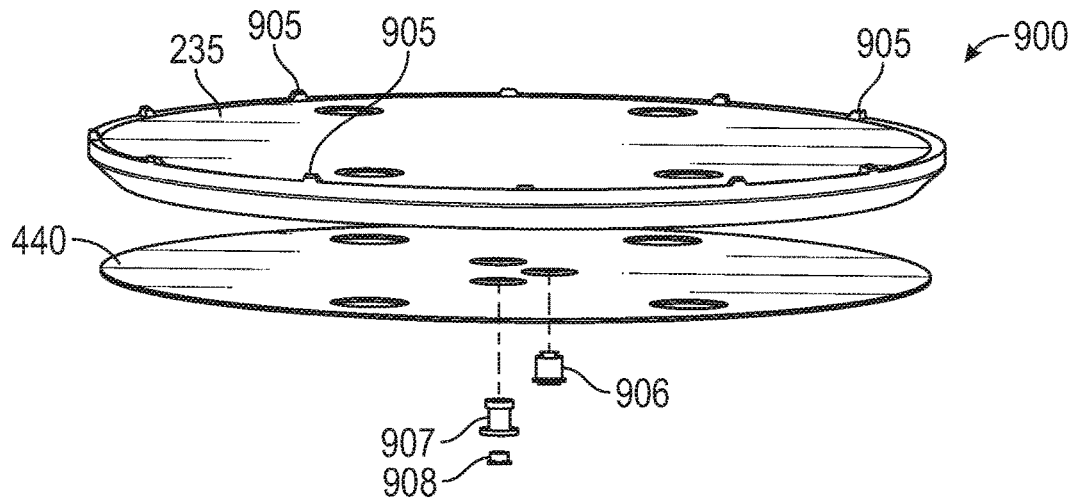
FIG. 9A is an isometric view of another embodiment of a substrate support.

FIG. 9A is an isometric view of another embodiment of a substrate support 900. The substrate support 900 may be utilized as the substrate support 110 in the deposition chamber 100 of FIGS. 1A and 1B. The substrate support 900 includes the mesh 440 on a lower surface of the body 235. The mesh 440 functions to assist in grounding of the body 235. The substrate support 900 also includes a plurality of centering features 905 positioned about a periphery of the body 235. Also shown in FIG. 9A are connection members shown as an insert 906, an eyelet 907 and a plug 908. The insert 906 is coupled to an opening (not shown) formed in the side of the body 235 opposite to the substrate receiving surface 202. Likewise, the eyelet 907 is coupled to an opening (not shown) formed in the side of the body 235 opposite to the substrate receiving surface 202, such as the center tap 405 shown in FIG. 5A. The plug 908 is also coupled to an opening (not shown) formed in the side of the body 235 opposite to the substrate receiving surface 202. Details of the openings for the insert 906, the eyelet 907 and the plug 908 are described in FIG. 10B.

Base materials for the body 235 of the substrate support 900 include graphite, aluminum nitride (AlN), silicon carbide (SiC), magnesium fluoride, or other suitable materials. Any of the above base materials may be coated with SiC (e.g., graphite with an SiC coating), silicon (e.g., graphite with a silicon coating), silicon dioxide (e.g., graphite with a silicon dioxide coating or SiC with a silicon dioxide coating), a lanthanum oxide coating, or combinations thereof.

Figure 9B:
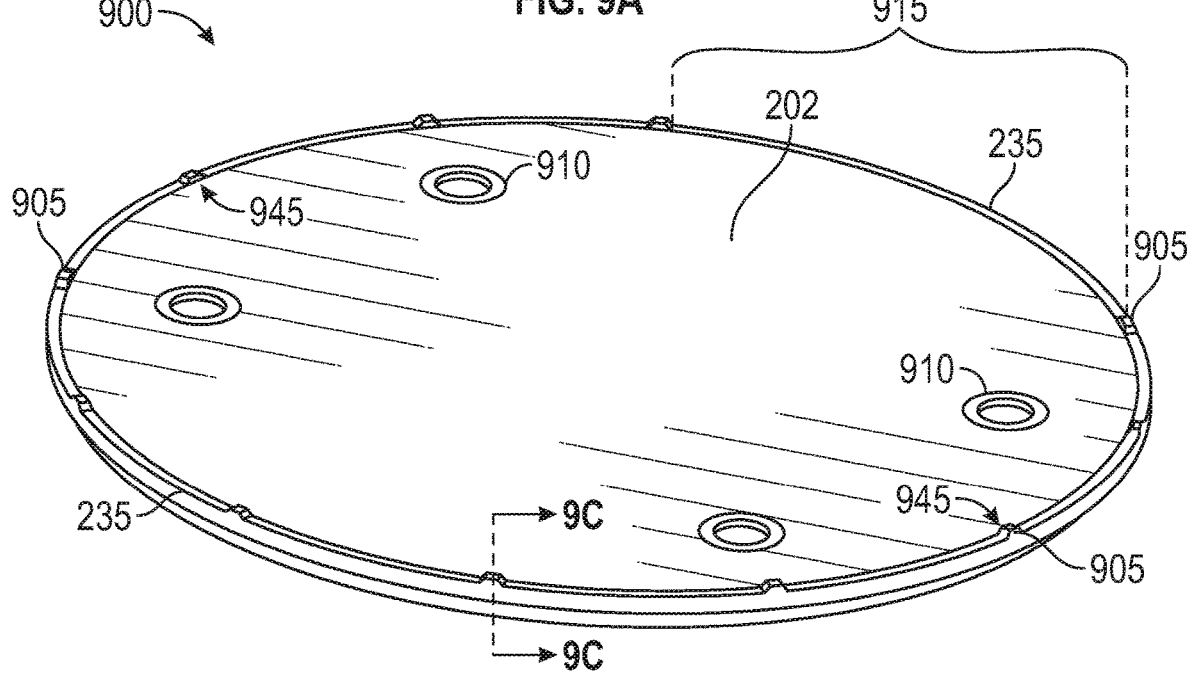
FIG. 9B is another isometric view of the substrate support of FIG. 9A showing the centering features.

FIG. 9B is another isometric view of the substrate support 900 showing the centering features 905 more clearly. A plurality of openings 910 are shown formed through the body 235. Each of the openings 910 are sized to receive a lift pin (not shown) that facilitates transfer of substrates between a robot blade (not shown) and the substrate receiving surface 202 of the substrate support 900. The centering features 905 are utilized to center a substrate relative to the substrate receiving surface 202 when the substrate is transferred thereto.

The centering features 905 are positioned on the body 235 in a generally symmetrical manner with the exception of a gap 915. The gap 915 is utilized to allow a robot blade (not shown) to pass between adjacent centering features 905.

Figure 9C:
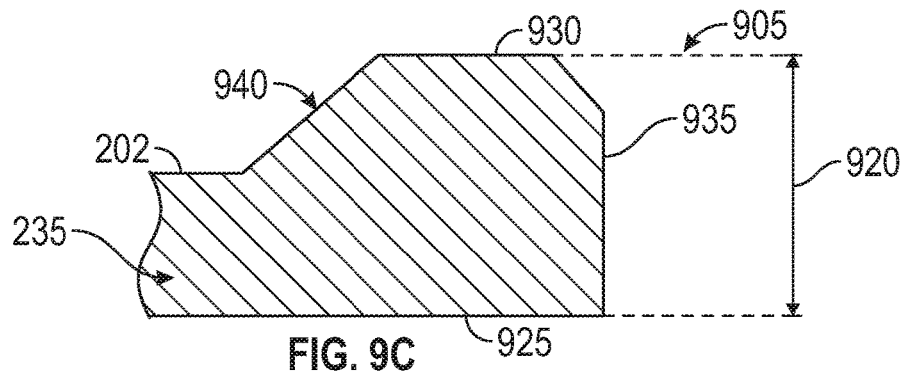
FIG. 9C is a sectional view of one of the centering features along lines 9C-9C of FIG. 9B.

FIG. 9C is a sectional view of one of the centering features 905 along lines 9C-9C of FIG. 9B. The centering feature 905 includes a height 920 measured from a bottom surface 925 of the body 235 and an upper surface 930 of a protruded portion 935. The protruded portion 935 includes an angled surface 940 that joins the upper surface 930 to the substrate receiving surface 202. The angled surface 940 acts as a guide that facilitates centering of a substrate.

The height 920 of the centering feature 905 may be about 1 mm to about 2.3 mm. The height 920 of each of the centering features 905 shown in FIG. 9B may vary. For example, the height 920 of one of the centering features 905 may be greater than the height 920 of adjacent centering features 905. In the example, shown in FIG. 9B, two of the centering features 905, shown as features 945 have a height that is less than heights of the remaining centering features 905. The uneven heights of the centering features 905 enables centering of flat substrates as well as substrates with a slight bow (e.g., warped substrates).

Figure 10A:
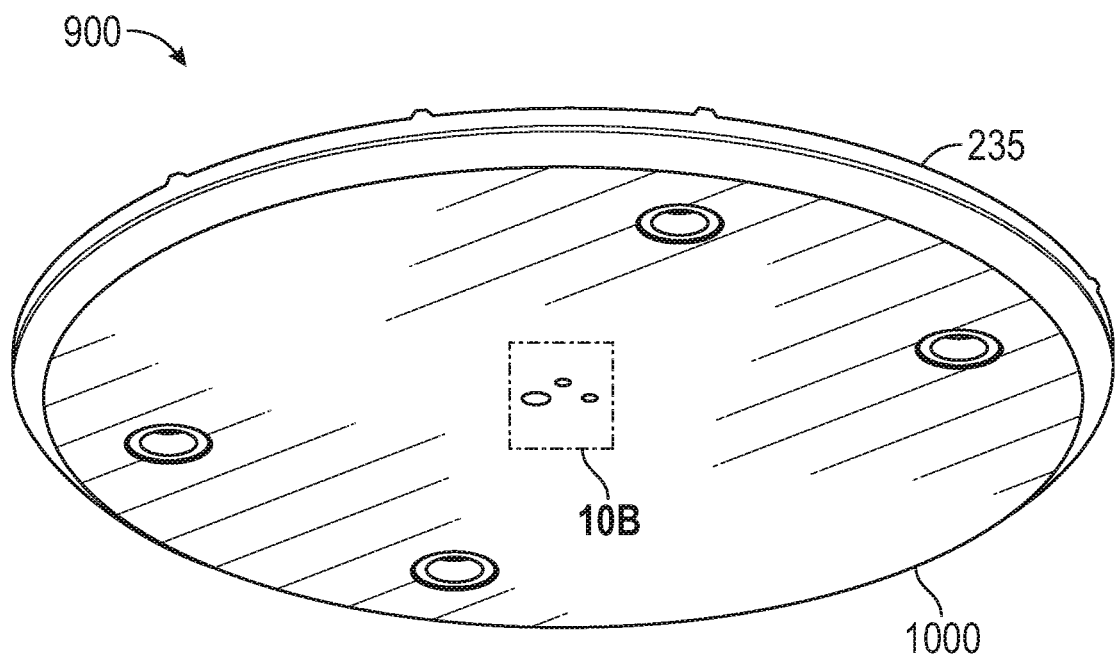
FIG. 10A is an isometric bottom view of the substrate support of FIG. 9A.
Figure 10B:
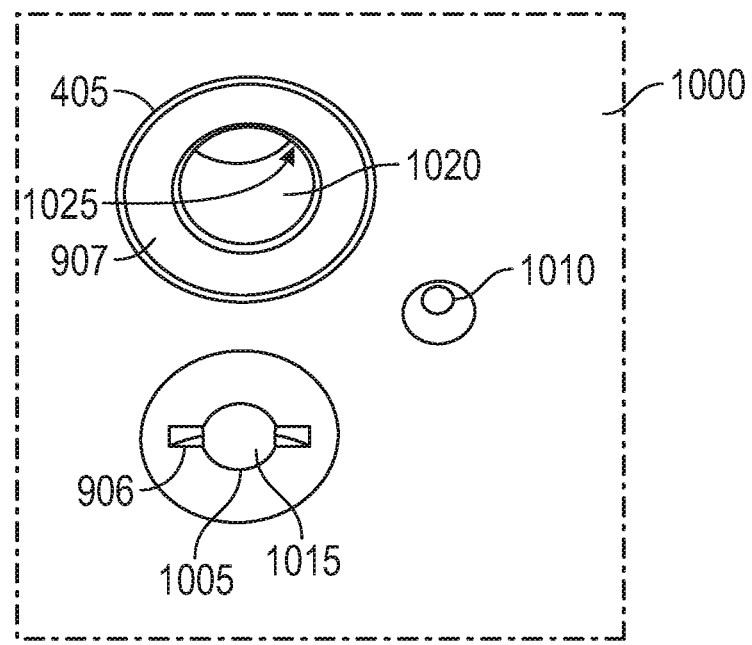
FIG. 10B is an enlarged view of a bottom surface of the body of the substrate support of FIG. 10A.

FIG. 10A is an isometric bottom view of the substrate support 900 of FIG. 9A. The mesh 440 is not shown in FIG. 10A. FIG. 10B is an enlarged view of a bottom surface 1000 of the body 235 of the substrate support 900.

The eyelet 907 is shown coupled to the center tap 405. The eyelet 907 may be threaded into the center tap 405. The eyelet 907 is made of an electrically conductive material, such as nickel. The eyelet 907 may also be coated with a gold (Au) or silver (Ag) to increase conductivity between the ground cable 210 (not shown) and the body 235.

The insert 906 is shown disposed in an opening 1005. The insert 906 has a center opening 1015 utilized as a mounting interface for the support arm 175 (not shown). The bottom surface 1000 also includes a tapered opening 1010 for the temperature sensor 230 (not shown). The eyelet 907 also includes a center opening 1020 sized to receive the ground cable 210 (not shown). The ground cable 210 is attached to the eyelet 907 via a threaded connection 1025.

Embodiments of the disclosure include methods and apparatus for a substrate support for use in a plasma chamber. The substrate support enables uniform temperature distribution thereon. The substrate support also minimizes interference from electrical fields, which maximizes temperature monitoring of the substrate support.

The invention claimed is:

1. A substrate support, comprising:
   a body having a substrate receiving surface and a bottom surface, the body comprising a dielectric material;
   a support arm assembly comprising:
      a support arm having a rounded interface portion disposed at a first end thereof and a mounting portion disposed at a second end thereof, the mounting portion including a distal end with converging sides;
      a cable guide configured to engage the rounded interface portion; and
      a channel formed in a lower side of the support arm and extending between the mounting portion and the rounded interface portion, wherein the cable guide includes a groove aligned with the channel;
      an electrically conductive mesh entirely embedded in the body;
   a center tap structure formed in a bottom surface of the body that is in electrical communication with the electrically conductive mesh;
   a dielectric cover plate having a rounded member and a linear extension extending from the rounded member, the dielectric cover plate configured to engage a bottom portion of the support arm to cover the channel;
   a dielectric cover having a generally circular shape with a radial recess, the dielectric cover configured to connect to the rounded interface portion of the support arm such that the radial recess engages the cable guide; and
   a spacing member disposed within the channel of the support arm and configured to extend along a temperature sensor cable from the rounded interface portion to the mounting portion.

2. The substrate support of claim 1, wherein the body is coupled to the support arm in a cantilevered manner.

3. The substrate support of claim 1, wherein the support arm is constructed to contain a ground cable that couples with the center tap structure.

4. The substrate support of claim 1, wherein the cable guide includes a curved portion.

5. The substrate support of claim 1, wherein the support arm comprises the spacing member comprising a dielectric material.

6. The substrate support of claim 5, wherein the spacing member comprises an elongate member comprising an electrically conductive coating.

7. The substrate support of claim 5, wherein the spacing member comprises a plurality of dielectric members.

8. The substrate support of claim 1, wherein the cable guide is positioned between the support arm and the body.

9. The substrate support of claim 1, wherein the body comprises a plurality of centering features.

10. A substrate support, comprising:
a body having a substrate receiving surface and a bottom surface, the body comprising a dielectric material;
a support arm assembly comprising:
a support arm having a rounded interface portion disposed at a first end thereof and a mounting portion disposed at a second end thereof, the mounting portion including a distal end with converging sides;
a cable guide configured to engage the rounded interface portion; and
a channel formed in a lower side of the support arm and extending between the mounting portion and the rounded interface portion, wherein the cable guide includes a groove aligned with the channel;
a center tap structure formed in the bottom surface that is in electrical communication with an electrically conductive mesh;
a plurality of connecting members coupled to the body, the plurality of connecting members including an eyelet that is coupled to the center tap structure;
a temperature sensor comprising:
a temperature sensor head configured to engage with the body, and
a temperature sensor cable configured to be disposed within the groove of the cable guide and to extend along the support arm from the rounded interface portion to the mounting portion within the channel; and
a spacing member disposed within the channel of the support arm and configured to extend along the temperature sensor cable from the rounded interface portion to the mounting portion.

11. The substrate support of claim 10, wherein the body is coupled to the support arm in a cantilevered manner.

12. The substrate support of claim 10, wherein the support arm is constructed to contain a ground cable that couples with the center tap structure.

13. The substrate support of claim 10, wherein the support arm includes a hollow shaft that is constructed to contain the temperature sensor that couples between the body and the hollow shaft.

14. The substrate support of claim 10, the spacing member comprises an electrically conductive coating.

15. The substrate support of claim 10, wherein the support arm comprises a plurality of dielectric members.

16. A substrate support, comprising:
a body having a substrate receiving surface and a bottom surface, the body comprising a dielectric material;
a support arm assembly comprising:
a support arm having a rounded interface portion disposed at a first end thereof and a mounting portion disposed at a second end thereof, the mounting portion including a distal end with converging sides;
a cable guide configured to engage the rounded interface portion; and
a channel formed in a lower side of the support arm and extending between the mounting portion and the rounded interface portion, wherein the cable guide includes a groove aligned with the channel;
a center tap structure formed in the bottom surface that is in electrical communication with an electrically conductive mesh;
a plurality of connecting members coupled to the body, the plurality of connecting members including an eyelet that is coupled to the center tap structure;
a dielectric cover plate having a rounded member and a linear extension extending from the rounded member, the dielectric cover plate configured to engage a bottom portion of the support arm to cover the channel;
a dielectric cover having a generally circular shape with a radial recess, the dielectric cover configured to connect to the rounded interface portion of the support arm such that the radial recess engages the cable guide;
a temperature sensor comprising:
a temperature sensor head configured to engage with the body, and
a temperature sensor cable configured to be disposed within the groove of the cable guide and to extend along the support arm from the rounded interface portion to the mounting portion within the channel; and
a spacing member disposed within the channel of the support arm and configured to extend along the temperature sensor cable from the rounded interface portion to the mounting portion.

17. The substrate support of claim 16, wherein the support arm is constructed to contain a ground cable that couples with the center tap structure.

18. The substrate support of claim 16, wherein the support arm includes a hollow shaft that is constructed to contain the temperature sensor that couples between the body and the hollow shaft.

19. The substrate support of claim 16, wherein the support arm comprises the spacing member comprising a dielectric material.

* * * * *